US010004133B2

(12) United States Patent
Liang et al.

(10) Patent No.: US 10,004,133 B2
(45) Date of Patent: Jun. 19, 2018

(54) APPARATUS AND TECHNIQUES TO TREAT SUBSTRATES USING DIRECTIONAL PLASMA AND REACTIVE GAS

(71) Applicant: Varian Semiconductor Equipment Associates, Inc., Gloucester, MA (US)

(72) Inventors: Shurong Liang, Poughkeepsie, NY (US); Costel Biloiu, Rockport, MA (US); Glen F. R. Gilchrist, Danvers, MA (US); Vikram Singh, Andover, MA (US); Christopher Campbell, Newburyport, MA (US); Richard Hertel, Boxford, MA (US); Alexander Kontos, Beverly, MA (US); Piero Sferlazzo, Marblehead, MA (US); Tsung-Liang Chen, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days. days.

(21) Appl. No.: 15/644,062

(22) Filed: Jul. 7, 2017

(65) Prior Publication Data
US 2017/0311430 A1 Oct. 26, 2017

Related U.S. Application Data

(63) Continuation of application No. 14/970,738, filed on Dec. 16, 2015, now Pat. No. 9,706,634.

(60) Provisional application No. 62/202,261, filed on Aug. 7, 2015.

(51) Int. Cl.
*H01L 21/3065* (2006.01)
*H05H 1/24* (2006.01)
*H01L 21/308* (2006.01)
*H01L 21/66* (2006.01)
*H01J 37/32* (2006.01)

(52) U.S. Cl.
CPC ......... *H05H 1/24* (2013.01); *H01J 37/32009* (2013.01); *H01J 37/3244* (2013.01); *H01J 37/32357* (2013.01); *H01J 37/32834* (2013.01); *H01L 21/308* (2013.01); *H01L 21/3065* (2013.01); *H01L 22/12* (2013.01); *H01L 22/20* (2013.01); *H01J 2237/327* (2013.01)

(58) Field of Classification Search
USPC ................ 427/523, 534, 98.8, 307; 118/715, 118/723 R; 250/379, 382; 264/677
See application file for complete search history.

(56) References Cited

U.S. PATENT DOCUMENTS

2014/0272179 A1* 9/2014 Radovanov ....... H01J 37/32357
427/523

* cited by examiner

*Primary Examiner* — Douglas W Owens
*Assistant Examiner* — Henry Luong

(57) ABSTRACT

An apparatus to treat a substrate. The apparatus may include a reactive gas source having a reactive gas outlet disposed in a process chamber, the reactive gas outlet to direct a first reactive gas to the substrate; a plasma chamber coupled to the process chamber and including an extraction plate having an extraction aperture extending along a first direction, disposed within the process chamber and movable along a second direction perpendicular to the first direction between a first position facing the reactive gas source and a second position facing the extraction aperture; and a gas flow restrictor disposed between the reactive gas outlet and the extraction aperture, the gas flow restrictor defining a differential pumping channel between at least the plasma chamber and substrate stage.

18 Claims, 6 Drawing Sheets

APPARATUS AND TECHNIQUES TO TREAT SUBSTRATES USING DIRECTIONAL PLASMA AND REACTIVE GAS

RELATED APPLICATIONS

This application claims priority to U.S. Non-Provisional patent application Ser. No. 14/970,738, filed Dec. 16, 2015, entitled "Apparatus And Techniques To Treat Substrates Using Directional Plasma And Reactive Gas," and further claims priority to U.S. Provisional Patent Application No. 62/202,261, filed Aug. 7, 2015, entitled "Apparatus And Techniques To Treat Substrates Using Directional Plasma And Reactive Gas" and incorporated by reference herein in its entirety.

FIELD

The present embodiments relate to device processing techniques, and more particularly, to apparatus for treating a substrate, including for treating the surface of a substrate.

BACKGROUND

As integrated devices continue to scale to smaller dimensions, the ability to pattern features becomes increasingly difficult. These difficulties include, in one aspect, the ability to etch features to preserve or transfer a pattern into a substrate. In many device applications, a patterned feature may have a smallest dimension less than 50 nm and in some cases the smallest dimension may be less than 10 nm. Moreover, the thickness of layers to be etched for building and patterning device structures may be less than 10 nm in some examples.

One technique developed to controllably etch thin layers is atomic layer etching (ALE) where etching takes place on a layer-by-layer basis. In a first operation, in an ALE apparatus a first reactant, such as a reactive gas, may be introduced to a substrate where the first reactant forms a self-limiting monolayer on a surface of the substrate. The self-limiting monolayer may include the first reactant and the upper layer of material from the substrate. Subsequently, the first reactant may be purged from the ALE system and in a further operation an etchant may be provided to remove the self-limiting monolayer. In this manner, one monolayer of a substrate may be etched at a time, providing accurate control of the amount of material to be removed.

One problem with the ALE process is the relatively slow rate of processing a substrate, since several operations are involved to etch one monolayer, including the time for purging a reactant material. Additionally, the removal of a self-limiting monolayer in known ALE processes may be suitable for etching planar structures, while providing less capability for etching non-planar structures, such as three dimensional (3D) structures where geometric selectivity is desired.

With respect to these and other considerations the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus to treat a substrate may include a reactive gas source having a reactive gas outlet disposed in a process chamber, the reactive gas outlet to direct a first reactive gas to the substrate; a plasma chamber coupled to the process chamber and including an extraction plate having an extraction aperture extending along a first direction; a substrate stage configured to hold the substrate, disposed within the process chamber and movable along a second direction perpendicular to the first direction between a first position facing the reactive gas source and a second position facing the extraction aperture; and a gas flow restrictor disposed between the reactive gas outlet and the extraction aperture, the gas flow restrictor defining a differential pumping channel between at least the plasma chamber and substrate stage.

In another embodiment, a system to treat a substrate may include a process chamber housing the substrate; a plasma chamber including an extraction plate having an extraction aperture extending along a first direction; a reactive gas source having a reactive gas outlet coupled to the plasma chamber, the reactive gas outlet to direct a first reactive gas to the plasma chamber; a substrate stage configured to hold the substrate, disposed within the process chamber and movable along a second direction perpendicular to the first direction; a bias power supply connected to at least one of the substrate stage and the plasma chamber, wherein a bias is generated by the substrate bias supply between the plasma chamber and substrate stage; and controller coupled the reactive gas outlet and to the bias power supply, the controller including a synchronizer to send a closing signal to close the reactive gas outlet and to send a negative bias signal to bias the substrate stage negatively with respect to the plasma chamber when the reactive gas outlet is closed.

In another embodiment, a method of etching a substrate may include directing a reactive gas to the substrate when the substrate is disposed in a process chamber, wherein a first product layer comprising the reactive gas and material from the substrate is formed on an outer surface of the substrate; directing a ribbon beam from a plasma chamber through an extraction aperture to an exposed portion of the substrate, the ribbon beam having a long axis along a first direction; and scanning the substrate along a second direction perpendicular to the first direction during the directing the reactive gas and the directing the ribbon beam, wherein the first product layer is etched from the substrate in the exposed portion, and is not etched from the substrate in an unexposed portion that is not exposed to the ribbon beam.

DETAILED DESCRIPTION

Figures 1A, 1B:
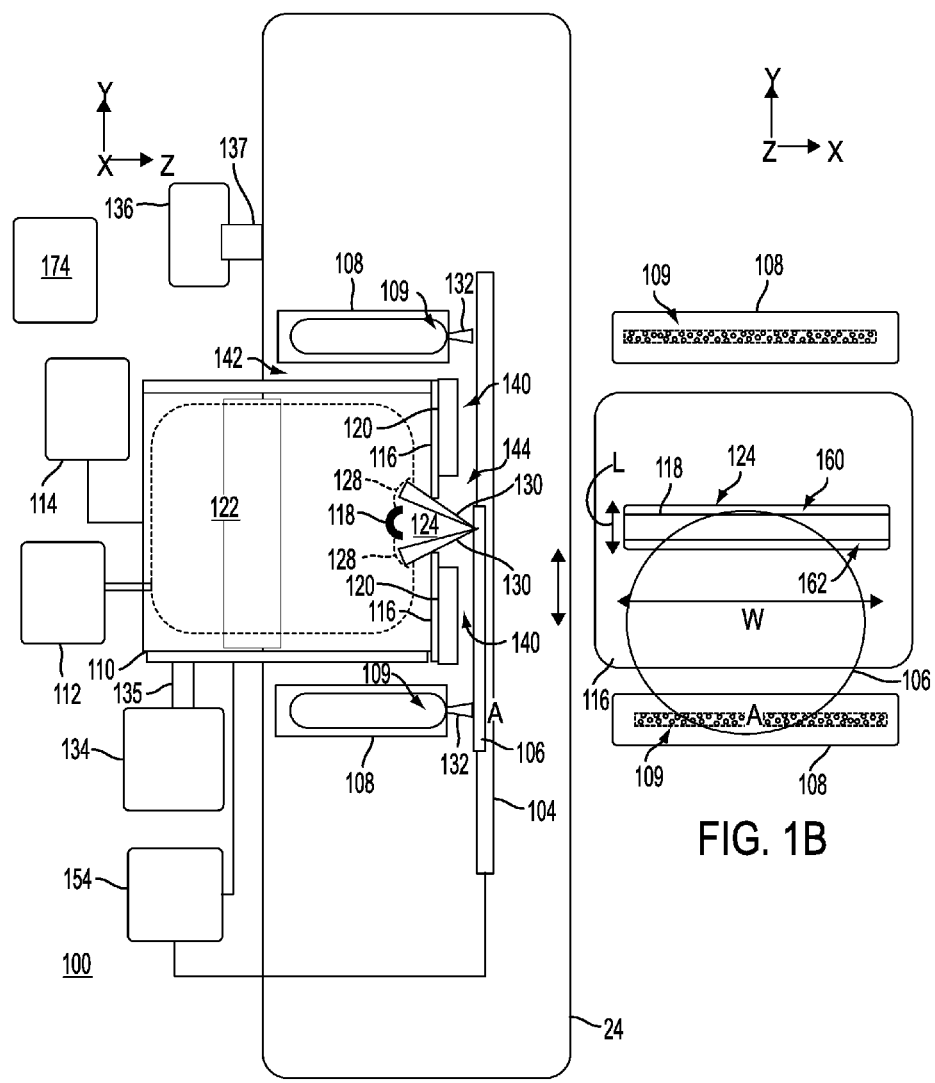
FIG. 1A depicts a system according to embodiments of the disclosure.
FIG. 1B depicts a plan view of an apparatus of the system of FIG. 1A.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel apparatus and novel techniques to treat substrates, such as to etch a substrate, including a surface feature on a substrate. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, metal layer, and so forth.

In various embodiments, apparatus are disclosed that provide ion beam (or "plasma beam") treatment of a substrate as well as reactive gas treatment of the substrate. The ion beam and reactive gas may be provided in a configuration and manner that delivers etching generally according to an atomic layer etching (ALE) process.

FIG. 1A depicts an apparatus, shown as a system 100, according to embodiments of the disclosure. The system 100 may be employed to perform etching of a substrate in various embodiments. The system 100 may include various components that operate together as an apparatus providing novel and improved etching of a substrate 106. As illustrated, the system 100 may include a process chamber 102 and a substrate stage 104 disposed within the process chamber 102. The substrate stage 104 may be movable at least along a direction parallel to the Y-axis in the Cartesian coordinate system shown and a 360-degree rotational motion along the Z-axis.

The system 100 further includes at least one reactive gas source, shown as the reactive gas source 108. The reactive gas source 108 may have a reactive gas outlet 109 disposed within the process chamber 102. The reactive gas source 108 may be employed to deliver reactive gas 132 to the substrate 106 when the substrate 106 is adjacent the reactive gas source 108. In various embodiments, the reactive gas 132 may be capable of reacting with material of the substrate 106, wherein a first product layer comprising the reactive gas 132 and material from the substrate 106 is formed on an outer surface of the substrate. For example, in one particular non-limiting embodiment, the reactive gas 132 may comprise chlorine or a chlorine-containing material, while the substrate 106 is silicon. The reactive gas 132 may be delivered as a neutral species, may be delivered as a radical, may be delivered as an ion or may be delivered as a combination of neutrals, radicals and ions in some embodiments. A product layer may form as layer composed of a monolayer of chlorine species bonded to an underlayer of silicon species. The embodiments are not limited in this context.

The system 100 further includes a plasma chamber 110. The plasma chamber 110 may include an extraction plate 116. As illustrated in FIG. 1A, the extraction plate 116 partially separates the plasma chamber 110 from the process chamber 102. The extraction plate 116 also includes an aperture 124 providing gaseous communication between the plasma chamber 110 and the process chamber 102, where the aperture 124 acts as an extraction aperture. In this manner, the plasma chamber 110 may be coupled to the process chamber 102. The aperture 124 may be an elongated aperture that extends along a first direction, such as parallel to the X-axis, as shown in FIG. 1B. For example, the aperture 124 may have a width W ranging between 100 mm and 500 mm in some embodiments and a length L ranging between 3 mm and 30 mm in some embodiments. The embodiments are not limited in this context. This elongated configuration of aperture 124 allows the extraction of an ion beam ("plasma beam") as a ribbon beam, meaning an ion beam having a cross-section where the beam width is greater than a beam length.

As further shown in FIG. 1A, the system 100 may include an inert gas source 112 coupled to the plasma chamber 110 to provide inert gas such as Ar, He, Ne, Kr, and so forth. The system 100 may further include additional components such as a power generator 114, where the components together form a plasma source to generate a plasma 122.

The plasma 122 may be generated by coupling electric power from a power generator 114 to the rarefied gas provided by inert gas source 112 in the plasma chamber 110 through an adequate plasma exciter (not shown). As used herein, the generic term "plasma source" may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art. Therefore, depending on the nature of the plasma source, the power generator 114 may be an rf generator, a dc power supply, or a microwave generator, while plasma exciter may include rf antenna, ferrite coupler, plates, heated/cold cathodes, helicon antenna, or microwave launchers. The system 100 further may include a bias power supply 154 connected to the plasma chamber 110 or to a substrate stage 104, or to the plasma chamber 110 and substrate stage 104. Although not explicitly shown, the plasma chamber 110 may be electrically isolated from the process chamber 102. Extraction of a plasma beam 130 comprising positive ions through the aperture 124 may accomplished by either elevating the plasma chamber 110 at positive potential and grounding the substrate stage 104 directly or via grounding the process chamber 102; or by grounding the plasma chamber 110 and applying negative potential on the substrate stage 104. The bias power supply 154 may operate in either a dc mode or pulsed mode having a variable frequency and duty cycle, or an AC mode. The extraction plate 116 may be arranged generally according to known design to extract ions in the plasma beam 130 in a manner that allows control of the ion angular distribution, i.e., the angle of incidence of the plasma beam 130 with respect to a substrate 106 and the angular spread as detailed below.

In some embodiments, just one plasma beam 130 may be extracted through the aperture 124. In other embodiments, a pair of plasma beams may be extracted through the aperture 124. For example, as illustrated in FIG. 1A and FIG. 1B, a beam blocker 118 may be disposed within the plasma chamber 110 and adjacent the aperture 124, where the beam blocker 118 defines a first extraction aperture 160 and second extraction aperture 162. As shown in FIG. 1A, two plasma beams 130 may be extracted from the plasma chamber 110 and directed to the substrate 106.

As further shown in FIG. 1A, the system 100 may include a pumping port 135 coupled to the plasma chamber 110 and a plasma chamber pump 134 connected to the pumping port 135. The plasma chamber pump 134 may be employed, for example, to reduce concentration of certain species within the plasma chamber 110, as discussed below. The system 100 may further include a process chamber pump 136 coupled to the process chamber 102 via a pumping port 137 to evacuate the process chamber 102.

The system 100 may further include a gas flow restrictor disposed between the reactive gas outlet and the extraction aperture, shown as the gas flow restrictor 120. As shown in FIG. 1A, for example, a gas flow restrictor 120 may be disposed on the outside of extraction plate 116 facing the substrate stage 104. The gas flow restrictor may define a differential pumping channel 140 between at least the plasma chamber 110 and substrate stage 104.

In operation, the substrate stage 104 may scan the substrate parallel to the Y-axis with respect to the extraction plate 116. In this manner, different portions of the substrate 106 may be exposed to the reactive gas 132 at different times. For example, the reactive gas outlet 109 may be elongated as shown in FIG. 1B and may have a width along the X-axis similar to the width W of the aperture 124, and a length along the Y-axis of 3 mm, for example. In various embodiments, the reactive gas outlet 109 may be composed of a multitude of small holes distributed over the X and Y dimensions to define an elongated shape as shown by the dashed lines, for uniform gas distribution along the X dimension. Moreover, the distance between the reactive gas source 108 and substrate 106 along the Z-axis may be 5 mm or less in some examples. The embodiments are not limited in this context. In this manner, the reactive gas 132 may be provided as a narrow elongated stream that covers the substrate 106 in its entirety along the X-axis, while just covering the substrate 106 over several millimeters in the direction parallel to the Y-axis. Accordingly, the entirety of the substrate 106 may be exposed to the reactive gas 132 in a sequential fashion by scanning the substrate along the Y-axis. Likewise, different portions of the substrate 106 may be exposed to the plasma beam(s) 130 at different times.

Additionally, as illustrated in FIG. 1B, a given region, such as a region A of the substrate 106, may be exposed to the reactive gas 132 and plasma beam 130 in a sequential fashion. In this manner, in an example of scanning the substrate 106 from bottom to top, a product layer made from the species of the reactive gas 132 and substrate 106 may initially be formed at the region A. The product layer may be an ALE layer as discussed above where the product layer is a monolayer formed by a self-limiting reaction. The product layer formed in region A may be subsequently etched by the plasma beam 130, when the region A is scanned upwardly under the plasma beam 130. In this manner, the substrate 106 may be etched in a monolayer-by-monolayer fashion by sequentially scanning the substrate under the reactive gas 132 and plasma beam 130.

In accordance with embodiments of the disclosure, the gas flow restrictor 120 may define a low conductance channel, shown as differential pumping channel 140, between at least the extraction plate 116 and substrate stage 104. As discussed below, the differential pumping channel 140 may establish a large pressure difference between one end of the differential pumping channel 140 and the other end. The reactive gas source 108 is separated from the plasma chamber 110 by a large conductance aperture in direct communication to a pumping source. The pumping source can be the process chamber pump 136 or any other pumping source made to communicate with aperture 142. If the conductance of aperture 142 is represented by C142 and the conductance of differential pumping channel 140 by C140, the flow of the reactive gas exiting the reactive gas source 108 and flowing through aperture 142 is proportional to C142/(C142+C140), while the amount of gas exiting the reactive gas source 108 and flowing through differential pumping channel 140 is proportional to C140/(C142+C140). In accordance with various embodiments, using appropriate design of aperture 142 and differential pumping channel 140 the partial pressure of the reactive gas in these two spatial regions may differ by 2 to 3 orders of magnitude. Using this differential pumping method, the system 100 may, for example, maintain a partial pressure of the reactive gas 132 adjacent the reactive gas outlet 109 of 1E-3 Torr, while having a partial pressure of 1E-6 Torr at the region 144 adjacent the aperture 124, leading to the plasma chamber 110.

A result of this pressure differential is that species of reactive gas 132 may be prevented from backstreaming into the region 144 or into plasma chamber 110, and may be preferentially pumped through the pumping port 137. This may facilitate the ability to control the composition of plasma beam 130, such as reducing or eliminating reactive gas species from the plasma beam 130. In this manner, a more controllable etch process may be realized by maintaining the exposure of substrate 106 to reactive gas 132 separate from the exposure to the plasma beam 130. Additionally or alternatively, the plasma chamber 110 may be evacuated by the plasma chamber pump 134, further reducing the concentration of species from reactive gas 132 in plasma chamber 110.

In accordance with various embodiments, the substrate stage 104 may be scanned sequentially under the reactive gas source 108 and plasma chamber 110 while the reactive gas source 108 and plasma chamber 110 are maintained in an ON state. In this manner, the system 100 may provide a high throughput ALE process. In particular, a purge cycle may be avoided where the reactive gas 132 would otherwise be purged between exposure to reactive gas and exposure to an etching process (e.g., plasma beam 130) as in known ALE processes. Moreover, in some embodiments, the substrate stage 104 may scan a substrate 106 back and forth (up and down in FIG. 1A) in a continuous fashion for a predetermined number of scan cycles in order to etch a predetermined amount of material from substrate 106. Since the thickness of a given product layer may be readily calculated, the total thickness to be etched may readily be controlled according to the number of scan cycles to be performed.

Figure 1C:
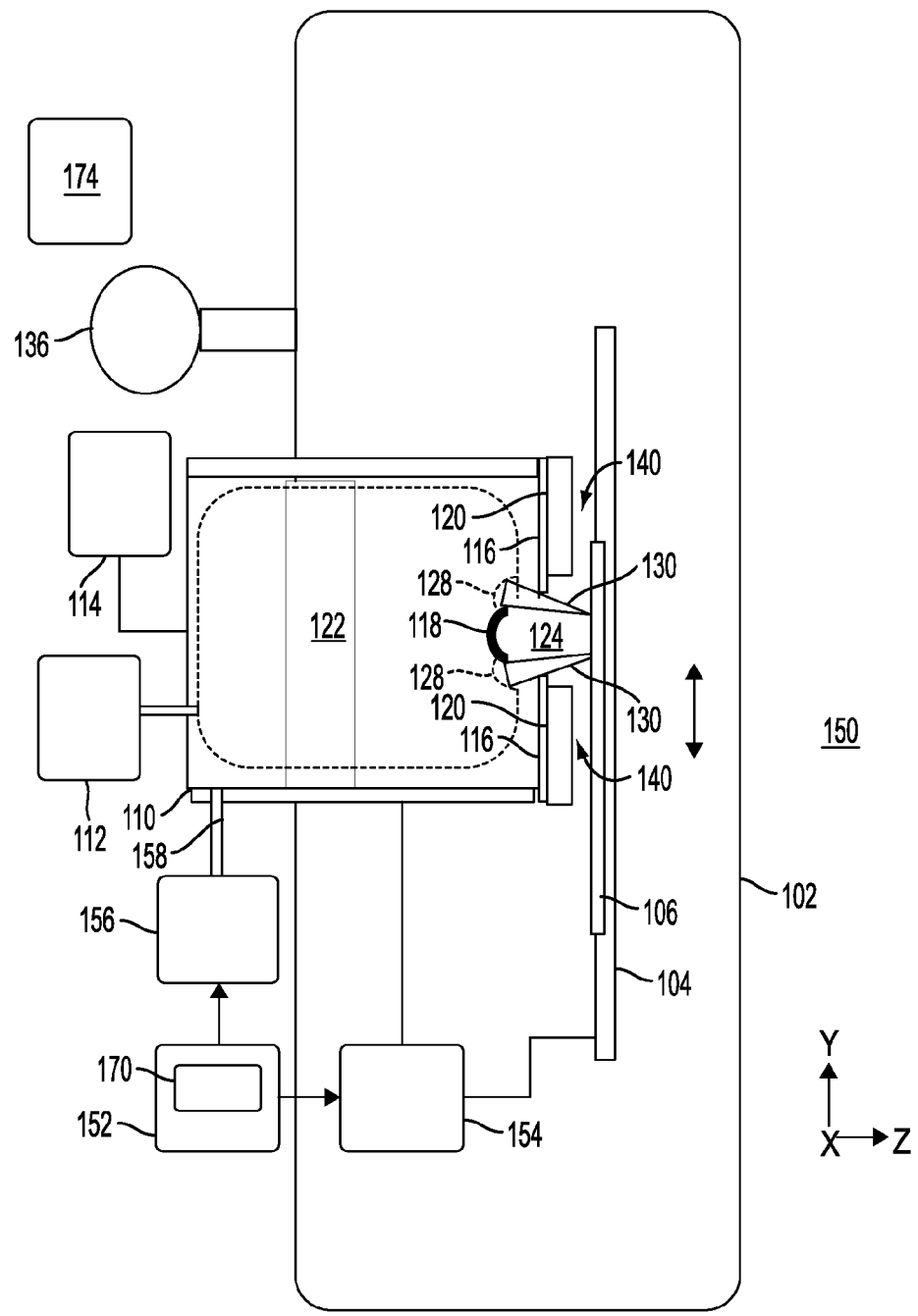
FIG. 1C depicts a first instance of operation of a further system according to embodiments of the disclosure.

Turning now to FIG. 1C, there is shown another system 150 according to further embodiments of the disclosure. The system 150 may share components with system 100 labeled similarly. A difference between system 150 and system 100 lies in the configuration for supplying reactive gas to the substrate 106. In system 150, a reactive gas source 156 having a reactive gas outlet 158 may be coupled to the plasma chamber 110, so the reactive gas outlet 158 may direct a first reactive gas to the plasma chamber 110. The system 150 may further include a controller 152 coupled to the reactive gas outlet 158 and bias power supply 154. The controller 152 may include a synchronizer 170 to send a closing signal to close the reactive gas outlet 158 and to send a negative bias signal to bias the substrate stage 104 negatively with respect to the plasma chamber 110 when the reactive gas outlet is closed. For example, the substrate stage 104 may be biased in the range between −10V to −10000V with respect to the plasma chamber 110. In this manner, the plasma beam(s) 130 may be extracted from the plasma chamber 110 at an ion energy adequate to etch a product layer formed on the substrate 106, while no reactive gas is directed to the substrate 106, as suggested in FIG. 1C. The synchronizer 170 may further send an open signal to the reactive gas outlet 158 and a positive bias signal to bias the substrate 106 positively with respect to the plasma chamber 110 when the reactive gas outlet 158 is open. In this manner, as shown in FIG. 1D, reactive gas streams 172 may be provided to the substrate 106 while no plasma beams 130 are extracted from the plasma 122, even while the plasma 122 may be present in the plasma chamber 110.

Figure 1D:
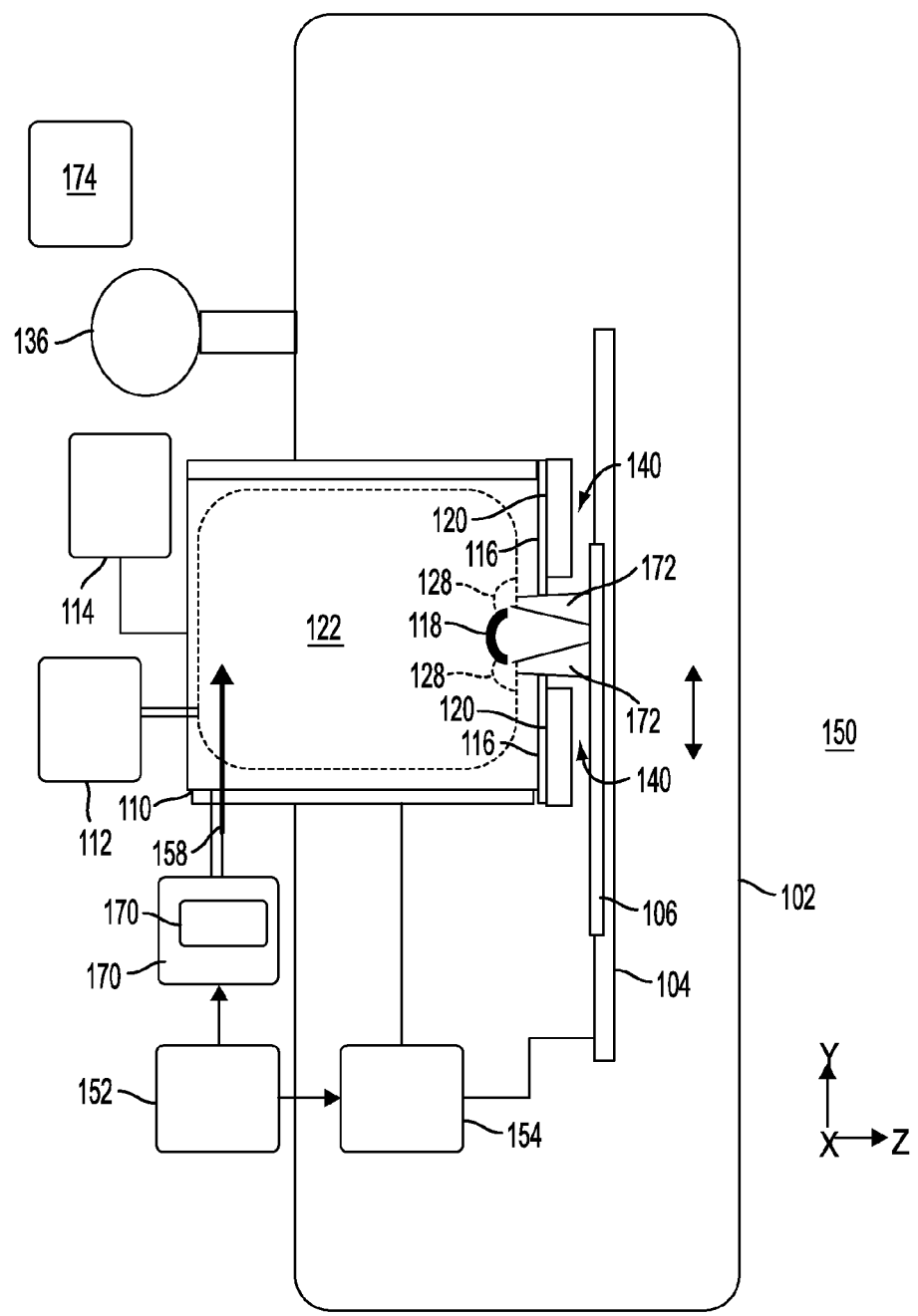
FIG. 1D depicts a second instance of operation of the system of FIG. 1C.

In one operation scenario, during a first scan of the substrate 106, for example, from bottom to top, the substrate 106 may be exposed to the reactive gas streams 172, as shown in FIG. 1D. This exposure may form a self-limiting product layer as discussed above. In a second scan from top to bottom, the product layer may be etched by closing the reactive gas outlet 158 while extracting the plasma beam(s) 130, as shown in FIG. 1C. In this manner, a given etch cycle effective to etch a monolayer of material from the substrate 106, may be completed by performing a scan under the scenario of FIG. 1D followed by a scan under the scenario of FIG. 1C.

As further shown in FIGS. 1A, 1C, and 1D, the system 100 and system 150 may further include a control system 174. The control system 174 may be coupled to various components of system 100 or system 150 including bias power supply 154, power generator 114, and the gas sources described above. The control system 174 may be arranged to vary at least one system parameter of system 100 or system 150. Examples of a system parameter include level of RF power applied to the plasma chamber 110, RF waveform, extraction voltage of the ion beam applied by the bias power supply 154, the duty cycle and frequency of the pulsed bias voltage, or z spacing between substrate 106 and extraction plate 116, meaning the spacing along the Z-axis between substrate 106 and extraction plate 116. The configuration of the extraction plate 116 is another example of a system parameter and may include the shape or size of apertures in the extraction plate, and so forth. At least one of these system parameters may be varied from a first value to a second value, wherein the plasma beam 130 has a first shape at the first value and a second shape at the second value. In this manner, parameters of the plasma beam 130, such as angle of incidence on the substrate, angular spread (ranges of angles of incidence), and so forth, may be controlled. This allows the plasma beam 130 to be directed to a substrate according to an application. For example, when the substrate 106 includes patterned features (not shown in FIG. 1A), vertical surfaces of a patterned feature may be better treated by directing the plasma beam 130 at a first angle of incidence, while horizontal surfaces may be better treated by directing the plasma beam 130 at a second angle of incidence.

Figure 2A:
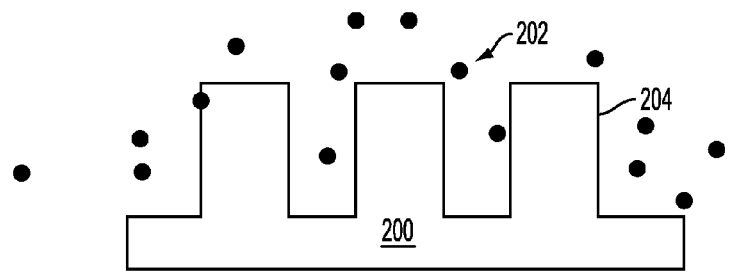
FIG. 2A through FIG. 2F depict an example of substrate etching according to embodiments of the disclosure.
Figure 2B:
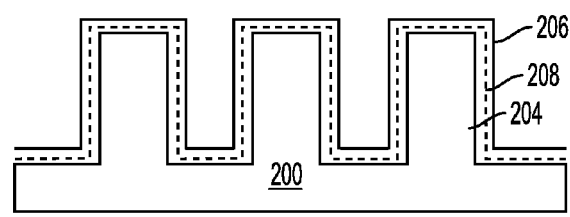

Turning now to FIG. 2A to FIG. 2F, there is shown one scenario according to embodiments of the disclosure, for performing directional ALE, or selective ALE, in order to etch a substrate. In various embodiments, the directional ALE may be performed using a system such as the system 100 or system 150. At FIG. 2A, there is shown a first instance where reactive gas 202 is directed to a substrate 200. For the purposes of illustration, the substrate 200 may be silicon. The substrate 200 may include an array of substrate features, shown as the substrate features 204, extending from a substrate plane 212 of the substrate 200. For example, the substrate features 204 may be line structures, fins, or mesas, in some embodiments. The substrate 200 in the illustration of FIG. 2A, may be a unitary structure where the planar portion and substrate features 204 are silicon. The reactive gas 202 may be capable of reacting with silicon to form a product layer 206, as shown in FIG. 2B. The product layer 206 may in some cases be a monolayer of material, and in some embodiments may be formed from material within the substrate 200 as well as species from reactive gas 202. The original surface 208 of the substrate 200 is shown in FIG. 2B. As illustrated, the product layer 206 may extend into the substrate 200.

Figure 2C:
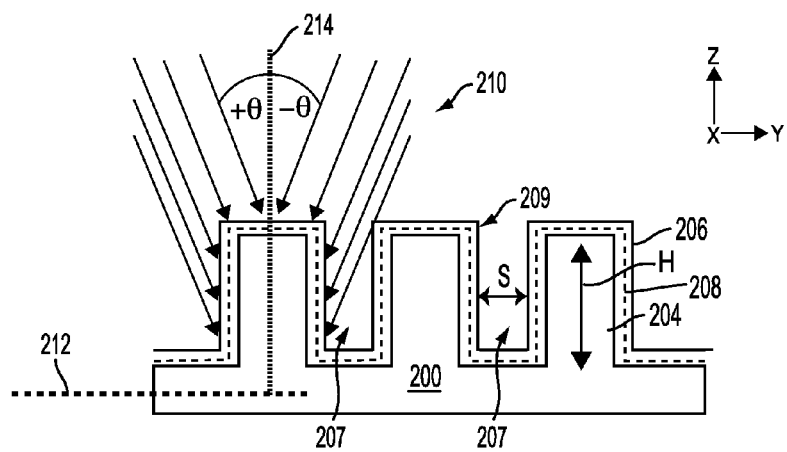

Turning now to FIG. 2C, there is shown a further instance where ions 210 are directed to the substrate 200 after formation of the product layer 206. In some embodiments, the ions 210 may be directed as a pair of plasma beams forming a non-zero angle of incidence $+\theta$ and an angle of incidence $-\theta$ with respect to a perpendicular 214 to a substrate plane 212, as shown. In particular embodiments the absolute value of the angle of incidence $+\theta$ and angle of incidence $-\theta$ are equal. The ions 210 may be inert gas ions in some embodiments, where the inert gas ions have an ion energy adequate to etch the product layer 206. The ions 210 may be provided at an ion energy and ion dose that does not etch the substrate 200 in regions underneath the product layer 206. As illustrated in FIG. 2C, the directionality of the ions 210 and the shape of the substrate features 204 may result in selective exposure of certain surfaces or portions of the substrate 200 to ions 210, while other portions are not exposed to the ions 210. As an example suggested by FIG. 2C, the substrate features 204 may be arranged in an array of features having a height H and spaced apart from one another by a distance S. Accordingly, when the ions 210 are directed at a non-zero angle of incidence with respect to the perpendicular 214, adjacent substrate features may shadow one another, preventing ions 210 from impinging upon certain regions of the substrate 200. In the example illustrated in FIG. 2C, ions 210 may be shadowed from impinging upon horizontal surfaces lying in the X-Y plane, at least within a region of an array of the substrate features 204. Because of this shadowing, unexposed portions of the substrate 200, such as the portions of product layer 206 on horizontal surfaces or in trench regions, shown as trenches 207, between adjacent substrate features, may remain unetched.

Figure 2D:
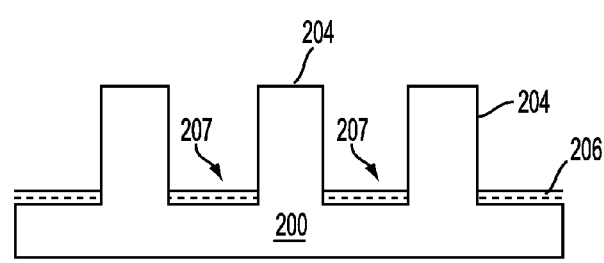
Figure 2E:
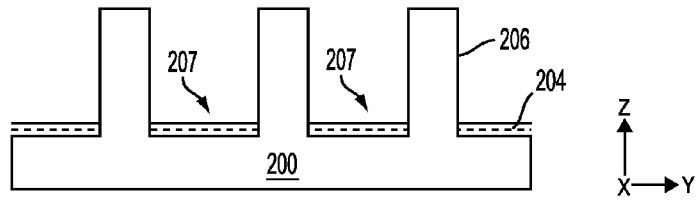
Figure 2F:
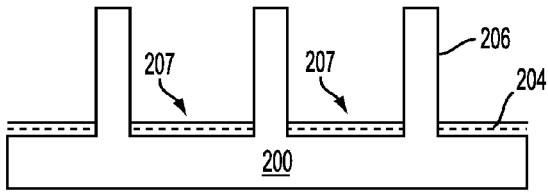

Turning now to FIG. 2D, there is shown an instance subsequent to the instance shown in FIG. 2C. At FIG. 2D, the substrate 200 includes substrate features 204 where the thickness of the substrate features 204 along the Y-axis is narrower than in FIG. 2A, while the trenches 207 remain unetched. As further shown in FIG. 2E and FIG. 2F, the operations of FIGS. 2B and 2C, comprising an etch cycle of directional ALE, may be repeated. In FIG. 2E, there is shown a structure of the substrate 200 after at least one additional etch cycle, where the substrate features 204 are further reduced in thickness while the trenches 207 continue to remain unetched. In FIG. 2F, there is shown a structure of the substrate 200 after at least one additional etch cycle is performed on the structure of FIG. 2E, where the substrate features 204 are further reduced in thickness while the trenches 207 continue to remain unetched.

Referring again to FIG. 2C, in other embodiments, the angle of incidence of ions 210 may be adjusted to a greater non-zero angle of incidence with respect to the perpendicular 214, so just portions of sidewalls 209 are exposed to the ions 210, such as top portions. In this manner, directional ALE may be applied to etch just top portions of substrate features.

In still further embodiments, ions may be directed along the perpendicular 214 so that horizontal surfaces of the substrate 200 are etched while sidewalls 209 remain unetched. This perpendicular directionality may provide a superior "vertical" atomic layer etching process as compared to known ALE techniques. In the known ALE techniques, processing conditions entail gas phase scattering resulting in etching ions impinging on a substrate over a range of angles in an uncontrolled fashion, so highly vertical etching of substrate features may not be readily accomplished.

Figure 3:
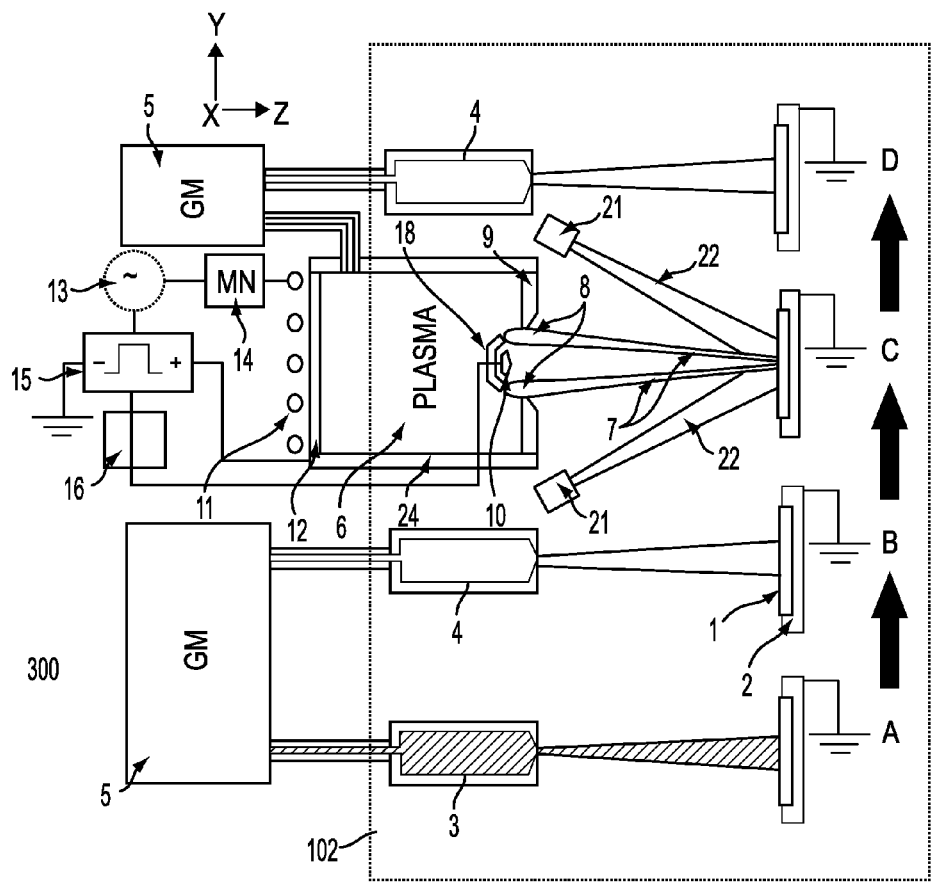
FIG. 3 presents one embodiment of another system according to embodiments of the disclosure.

FIG. 3 presents one embodiment of a system 300 to enable directional ALE (D-ALE). The substrate 1 may be provided in the process chamber 102. The substrate 1 may be clamped to the substrate stage 2, where the substrate stage 2 is movable so the substrate 1 travels upwards to intercept reactive gas. The reactive gas may be provided by tunable reactive gas source 3 and tunable reactive gas source 4, for example. UV radiation source(s) 21 may direct UV radiation 22, where the UV radiation is intercepted by the substrate 1 as the substrate 1 is further scanned upward. The substrate 1 may further be exposed to dual angle ion beams, shown as ion beams 7, and extracted from a plasma 6 formed in the plasma chamber 24. The substrate 1 may be scanned further to intercept a second stream of reactive gas output by a second tunable reactive gas source, also shown as tunable reactive gas source 4. The system 300 may provide the ion beams 7 at controllable ion energy and angular distribution, meaning the range of angles of incidence as well as the relative amount of ions at a given angle of incidence. The ion beams 7 may be extracted by an extraction optics composed of an extraction plate 9 as generally described above. The system 300 may also include a beam blocker 18 as described above, as well as a deflection electrode 10.

The plasma 6 may be generated by admission of given gas mixture from a gas manifold 5 into the plasma chamber 24, while coupling if power from an rf antenna 11 to the gas mixture through a dielectric rf window 12. The if power to ignite and sustain the discharge may be provided by an rf generator 13 through a matching network 14. Ion energy of ions in the ion beams 7 may be controlled by a pulsed dc power supply 15, where the pulsed dc power supply may maintain the plasma chamber 24 at elevated positive electrostatic potential while the substrate stage 2 and the substrate 1 are maintained at ground potential. The system 300 may further include a dc power supply, shown as the deflection voltage supply 16, coupled to the deflection electrode 10. The ion angular distribution of ions in the ion beams 7 may be controlled by varying the negative bias voltage applied to the deflection electrode from the deflection voltage supply 16. In particular, the deflection electrode 10 may be disposed adjacent the beam blocker 118, wherein the beam blocker 118 is disposed between the plasma chamber 24 and deflection electrode 10. The voltage applied to deflection electrode 10 may generate an electric field that deflects the ion beams 7 as the ion beams 7 are extracted from the plasma 6. In particular, this may serve to vary the angle of incidence of the ion beams 7 when the deflection voltage is varied to deflection electrode 10. The deflection electrode 10 may accordingly provide the ability to conveniently vary portions of substrate features etched by ALE by merely varying voltage. In various embodiments, this varying of voltage may be performed in a dynamic fashion during processing of a substrate or group of substrates.

During exposure to low energy ions and reactants, excited molecules and radicals from plasma chamber 24, a product monolayer formed by exposure to the tunable reactive gas source 3 or tunable reactive gas source 4 may be etched away. The ion and radicals flux may be controlled by adjusting either the power delivered to the if discharge and/or the gas flow rate. An irradiation dose received by the substrate 1 may be adjusted by adjusting the scanning speed along the direction parallel to the Y-axis. For certain reactions, in addition to independent ion bombardment, UV photon irradiation may be helpful for removal of a surface product layer. The photon energy of a few eV provided by UV radiation facilitates breakage of surface bonds while not affecting the material beneath the monolayer of product layer disposed on the surface of the substrate 1. Accordingly, at least one of UV radiation source(s) 21 may be employed to generate UV radiation 22. In some embodiments for processing substrates having dimensions up to 300 mm, the UV radiation sources 21 may extend in the direction parallel to the X-axis for 350 mm to illuminate uniformly an entirety of a substrate width. The photon flux may adjusted by adjusting the power delivered to the UV radiation sources 21, while the irradiation dose may be adjusted by adjusting the scanning speed along the Y-axis. In some embodiments, the substrate 1 may be scanned along a scan direction from position A to position B to position C to position D, where the substrate 1 may be exposed to a second tunable reactive gas source, shown also as the tunable reactive gas source 4. The substrate 1 may scanned in a continuous fashion in some embodiments. A directional ALE etch cycle may be completed by scanning the substrate from position A to position B to position C to position D one time. This etch cycle may be repeated as needed to etch a target thickness of material from the substrate 1. In some variants, a gas flow restrictor may be provided in the system 300 as described above with respect to FIG. 1A.

Figure 4:
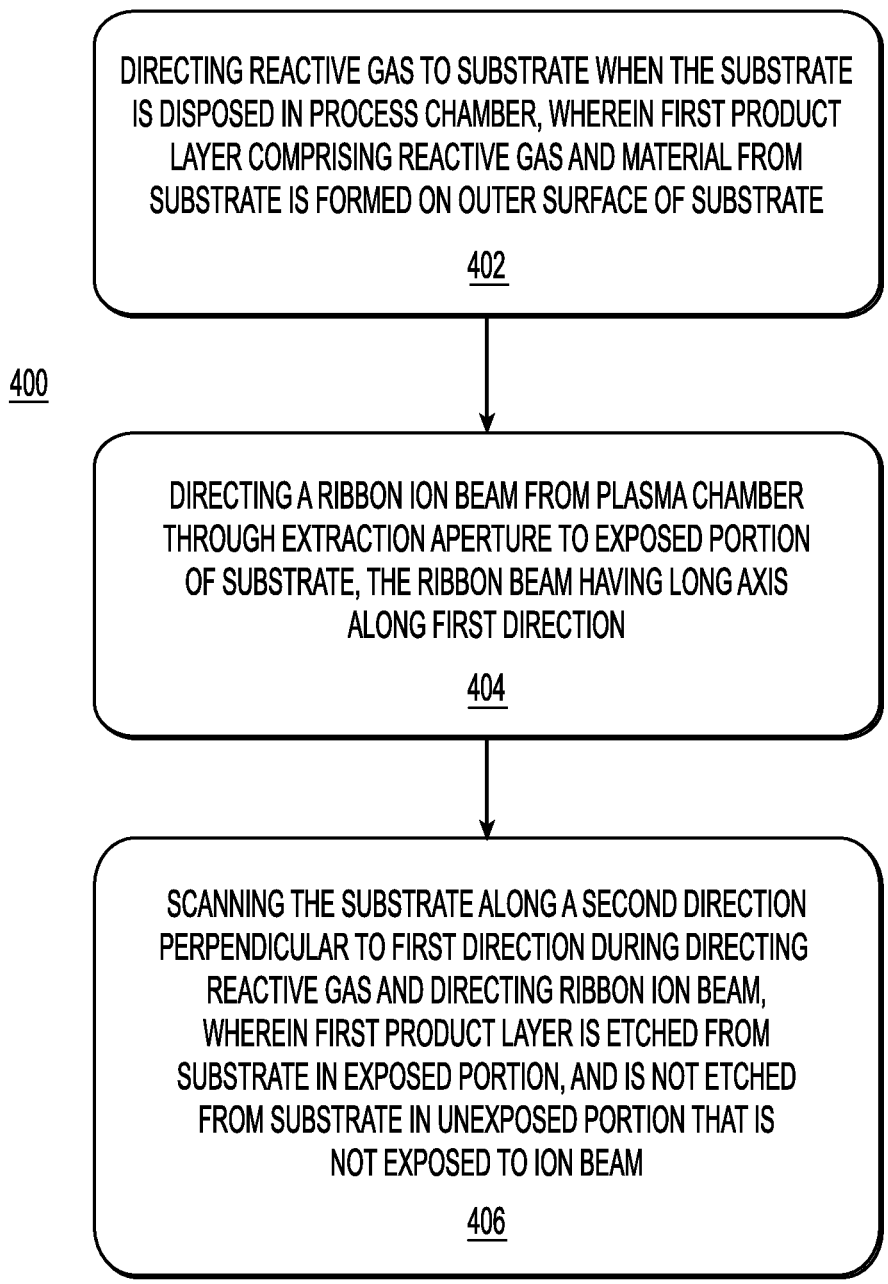
FIG. 4 depicts an exemplary process flow.

FIG. 4 depicts an exemplary process flow according to embodiments of the disclosure. At block 402, the operation is performed of directing a reactive gas to the substrate when the substrate is disposed in a process chamber, wherein a first product layer comprising the reactive gas and material from the substrate is formed on an outer surface of the substrate. At block 404, the operation is performed of directing a ribbon beam from a plasma chamber through an extraction aperture to an exposed portion of the substrate, the ribbon beam having a long axis along a first direction. At block 406, the operation is performed of scanning the substrate along a second direction perpendicular to the first direction during the directing the reactive gas and the directing the ribbon beam, wherein the first product layer is etched from the substrate in the exposed portion, and is not etched from the substrate in an unexposed portion that is not exposed to the ribbon beam.

The present embodiments provide various advantages over conventional processing to define features in a substrate. One advantage lies in the ability to perform atomic layer etching without having to perform purging after exposure to reactive gas, providing a higher throughput process. Another advantage is the ability to selectively etch chosen surfaces or regions of a substrate using an ALE process by control of an angle of incidence of ion beams directed to a substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A system to treat a substrate, comprising:
a process chamber housing the substrate;
a plasma chamber, adjacent the process chamber and including an extraction plate having an extraction aperture extending along a first direction;
a reactive gas source having a reactive gas outlet coupled to the plasma chamber;
an inert gas source having an inert gas outlet coupled to the plasma chamber;
a bias power supply connected to at least one of a substrate stage and the plasma chamber, wherein a bias is generated by the bias power supply between the plasma chamber and the substrate stage; and
a controller coupled the reactive gas outlet and to the bias power supply, the controller including a synchronizer to send a closing signal to close the reactive gas outlet and to send a negative bias signal to bias the substrate stage negatively with respect to the plasma chamber when the reactive gas outlet is closed.

2. The system of claim 1, the synchronizer to send an open signal to the reactive gas outlet and a positive bias signal to bias the substrate positively with respect to the plasma chamber when the reactive gas outlet is open.

3. The system of claim 1 further comprising a beam blocker disposed within the plasma chamber and adjacent the extraction aperture, the beam blocker defining a first extraction aperture and second extraction aperture.

4. The system of claim 3, further comprising:
a deflection electrode disposed adjacent the beam blocker, wherein the beam blocker is disposed between the plasma chamber and the deflection electrode; and
a deflection voltage supply connected to the deflection electrode.

5. The system of claim 1, the extraction aperture comprising a width, along the first direction, of 100 mm to 400 mm, and a length, along a second direction, of 2 mm to 30 mm.

6. The system of claim 1, wherein an ion beam extracted through the extraction aperture forms a non-zero angle of incidence with respect to a perpendicular to a substrate plane.

7. The system of claim 6, wherein the substrate stage is configured to hold the substrate, is disposed within the process chamber and movable along a second direction perpendicular to the first direction.

8. The system of claim 7, wherein the ion beam comprises a long axis along the first direction perpendicular to the second direction.

9. A method of etching a substrate, comprising;
forming a plasma in a plasma chamber using an inert gas from an inert gas source;
directing a reactive gas to the substrate through the plasma chamber when the substrate is disposed in a process chamber, adjacent the plasma chamber, wherein a first product layer comprising the reactive gas and material from the substrate is formed on an outer surface of the substrate, wherein the directing the reactive gas to the substrate comprises: sending an OPEN signal to a reactive gas outlet coupled to a reactive gas source, and a positive bias signal to bias the substrate positively with respect to the plasma chamber when the reactive gas outlet is open; and extracting an ion beam from the plasma chamber through an extraction aperture, the extracting the ion beam comprising: sending a negative bias signal to bias a substrate stage negatively with respect to the plasma chamber when the reactive gas outlet is closed,
wherein the first product layer is etched from the substrate in an exposed portion of the substrate that is impacted by the ion beam, and is not etched from the substrate in an unexposed portion of the substrate, the unexposed portion not being exposed to the ion beam.

10. The method of claim 9, wherein the plasma is present in the plasma chamber during the directing the reactive gas.

11. The method of claim 9, wherein the reactive gas flows into the plasma chamber through the reactive gas outlet, and through the extraction aperture to the substrate.

12. The method of claim 9, comprising scanning the substrate stage holding the substrate along a scan direction with respect to the extraction aperture.

13. The method of claim 9, wherein the ion beam forms a non-zero angle of incidence with respect to a perpendicular to a substrate plane.

14. The method of claim 9, wherein the substrate comprises an array of substrate features, wherein a given substrate feature includes a sidewall and wherein the substrate includes a trench region between adjacent substrate features of the array of substrate features, wherein the first product layer is removed from the sidewall and is not removed from the trench region.

15. The method of claim 12, wherein the ion beam comprises a long axis along a first direction perpendicular to the scan direction.

16. The method of claim 9, further comprising:
providing a deflection electrode adjacent the extraction aperture; and
applying a deflection voltage to the deflection electrode, wherein an angle of incidence with respect to a perpendicular to a substrate plane is varied from a first angle of incidence to a second angle of incidence.

17. The method of claim 9, wherein the directing the reactive gas, scanning the substrate stage, and directing the ion beam comprise a first etch cycle, the method further comprising performing at least one additional etch cycle, wherein in a given etch cycle a given thickness of the first product layer is removed from the substrate.

18. A method of etching a substrate, comprising;
directing a reactive gas to the substrate when the substrate is disposed in a process chamber, wherein a first product layer comprising the reactive gas and material from the substrate is formed on an outer surface of the substrate;
extracting an ion beam from a plasma chamber through an extraction aperture, wherein the ion beam impacts an exposed portion of the substrate;
wherein the first product layer is etched from the substrate in the exposed portion, and is not etched from the substrate in an unexposed portion of the substrate, the unexposed portion not being exposed to the ion beam,
wherein the substrate comprises an array of substrate features, the substrate features spaced apart from one another by a distance S, the distance S defined by a trench disposed between adjacent substrate features, and
wherein the distance S increases after the directing the reactive gas and the extracting the ion beam, while the trench remains unetched.

* * * * *